United States Patent [19]

Shimura et al.

[11] Patent Number: 4,843,637
[45] Date of Patent: Jun. 27, 1989

[54] TUNER CIRCUIT

[75] Inventors: Toshio Shimura, Fukaya; Masahiko Yamada, Takasaki; Yoshiteru Ishii; Fuminobu Tamase, both of Fukaya, all of Japan

[73] Assignee: Kabushiki Kaisha Toshiba, Kanagawa, Japan

[21] Appl. No.: 935,849

[22] Filed: Nov. 28, 1986

[30] Foreign Application Priority Data

Nov. 28, 1985 [JP] Japan .................. 60-266016

[51] Int. Cl.4 .......................... H04B 1/10
[52] U.S. Cl. .................. 455/200; 455/249; 455/295; 455/317
[58] Field of Search ............... 455/249, 200, 296, 302, 455/310, 311, 317, 318, 319, 295, 315

[56] References Cited

U.S. PATENT DOCUMENTS

| | | | |
|---|---|---|---|
| 4,090,137 | 5/1978 | Soma et al. | 455/295 |
| 4,126,828 | 11/1978 | Kumagai | 455/295 |
| 4,520,507 | 5/1985 | Moon | 455/249 |
| 4,580,288 | 4/1986 | Rinderle | 455/249 |
| 4,580,290 | 4/1986 | Ushida | 455/319 |
| 4,661,995 | 4/1987 | Kashiwagi | 455/317 |
| 4,665,560 | 5/1987 | Lange | 455/249 |
| 4,691,379 | 9/1987 | Shizume | 455/319 |
| 4,726,072 | 2/1988 | Yamashita et al. | 455/315 |
| 4,776,040 | 10/1988 | Ichikawa et al. | 455/315 |

Primary Examiner—Robert L. Griffin
Assistant Examiner—Curtis Kuntz
Attorney, Agent, or Firm—Finnegan, Henderson, Farabow, Garrett & Dunner

[57] ABSTRACT

A tuner circuit for converting the frequency of an input signal with a local oscillator to a predetermined channel frequency. The tuner circuit includes an attenuation circuit responsive to the input signal for controlling the attenuated level of the input signal for reducing cross modulation and intermodulation distortions of the circuit, and for reducing distortion from the interference of the local oscillation, an amplifier circuit coupled to the attenuation circuit for amplifying the attenuated input signal, and a frequency conversion circuit coupled to the amplifier circuit for converting the frequency of the amplified input signal to a corresponding predetermined channel frequency.

1 Claim, 7 Drawing Sheets

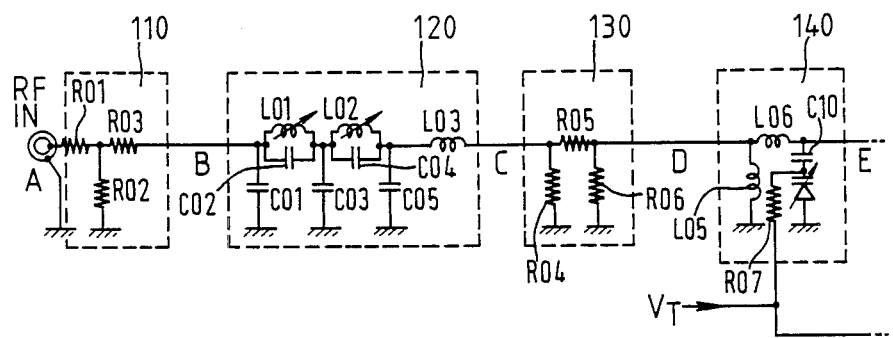
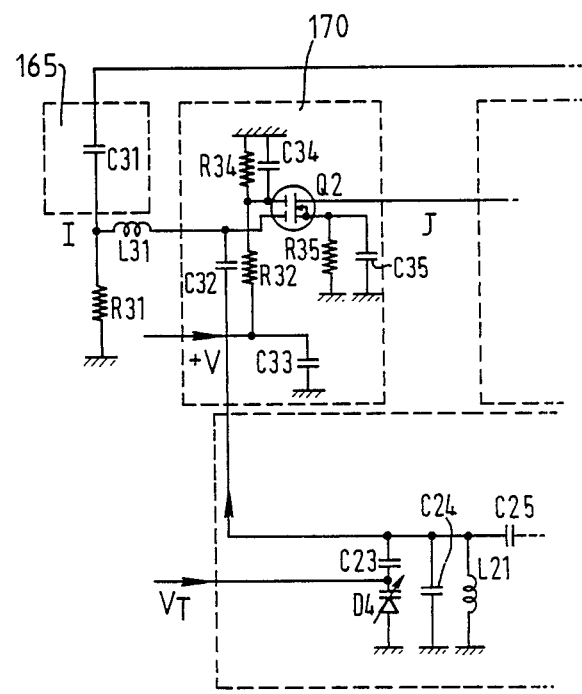
FIG. 1(1/2)

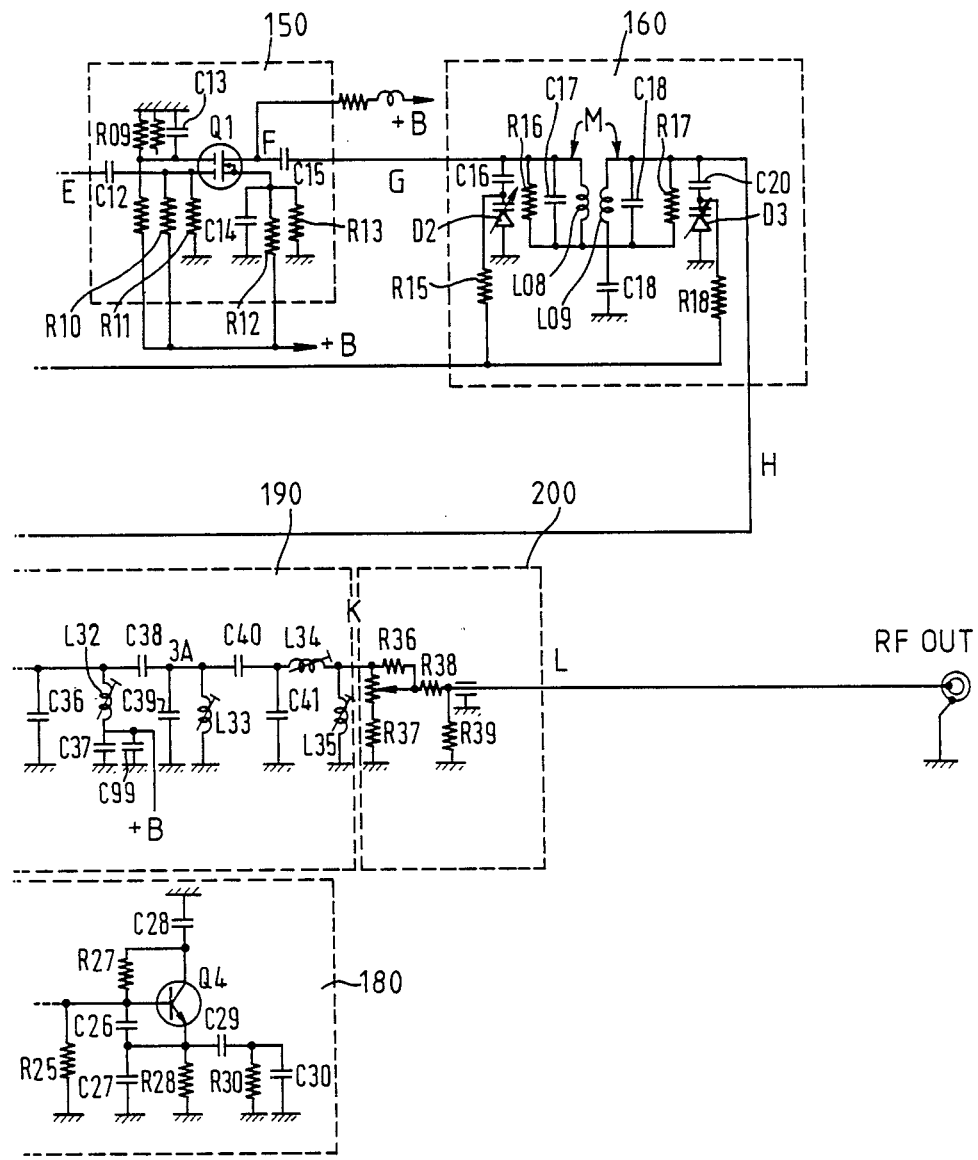
FIG. 1(2/2)

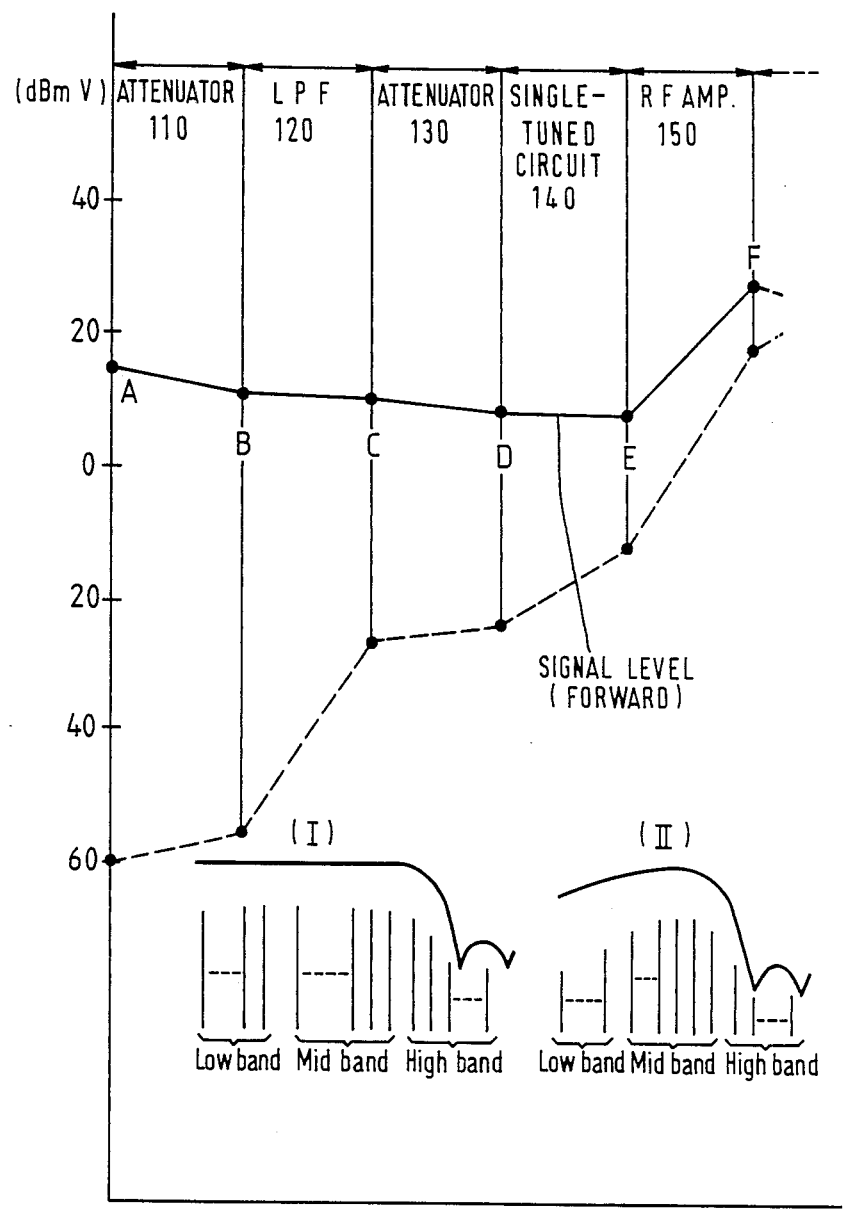
FIG. 2 (½)

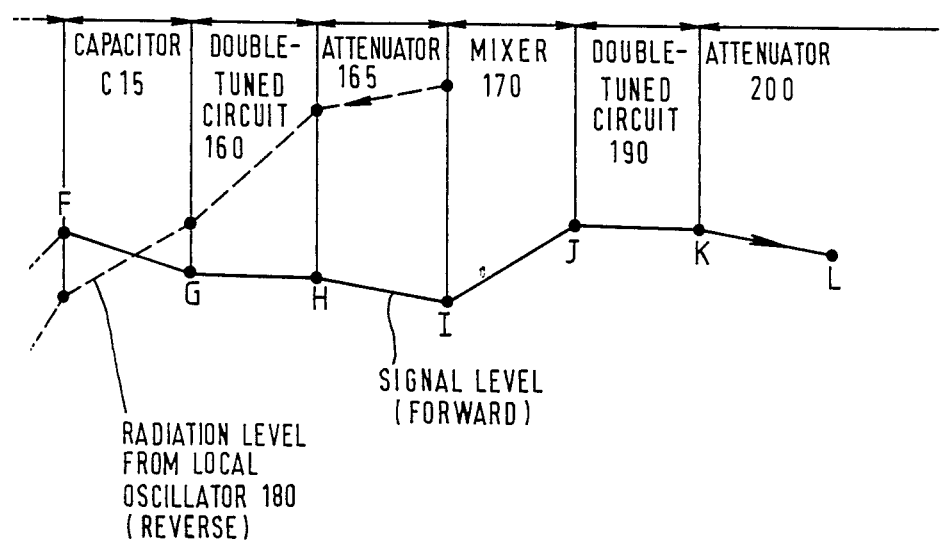
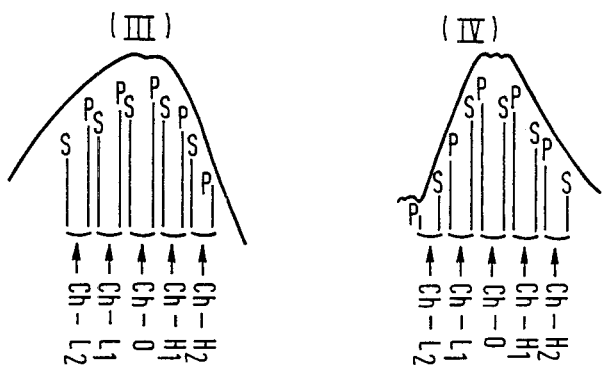
FIG. 2 (2/2)

TUNER CIRCUIT

BACKGROUND OF THE INVENTION

1. Field of the Invention

The present invention relates to a television tuner circuit, and more particularly, to a tuner circuit in which the influence of leakage from a local oscillator output and the influence by return loss can be prevented and in which deterioration of distortion characteristics can be reduced.

2. Description of the Prior Art

Generally, the fundamental function of a tuner is to convert a received high-frequency signal into an intermediate frequency. Also, in a frequency conversion operation, the C/N (Carrier to Noise) ratio is so low that power gain is required. In this case, from the aspect of generation of distortion such as cross modulation distortion, it is necessary to control the gains of the several sections of the tuner. However, removal of signal distortion and deterioration of C/N ratio are incompatible. A problem arises as to whether suppression of signal distortion in a tuner and prevention of deterioration of C/N ratio both can be realized.

The problem also arises not only in receivers for a usual television broadcast, but also in the case of CATV broadcast which is in a form of a multi-channel broadcast having many transmission channels.

As an example of the arrangement of channel frequencies for a CATV service, there is a CATV independent broadcast band called a midband. For example, in the Japanese territory, ch.A to ch.I are allotted in the empty frequency band between 3ch and 4ch. In the midband, the frequency of each channel is set so that the relation of frequency band, picture carrier, audio carrier, and color subcarrier frequency per one channel is the same as in a normal channel. As a result, disturbance by a local oscillator output leaked from a receiver against the receivers of other subscribers is eliminated. The same is true in the CATV broadcast on a midband in U.S.A.

In a CATV broadcast, a multi-channel broadcast capability is one of the beneficial characteristics, but a problem arises in that unnecessary signals are generated such as beat signals resulting from the large number of channels. These unnecessary signals promote generation of new unnecessary signals by non-linear distortion caused by the active elements of a tuner.

As described above, noise in a signal obtained through a transmission system may be prevented by suppressing the generation of distortion signals.

FIG. 4 shows a tuner circuit known as a so-called up-down tuner to be used for a multichannel broadcast tuner in a CATV system.

In FIG. 4, a multichannel CATV output is applied to an input terminal 1. Then, it is applied to a first mixer 4 through a band-pass filter substantially formed of a high-pass filter 2 and a low-pass filter 3. The oscillation output of a first local oscillator 6 is applied to the first mixer 4 through an amplifier 5, and the input signal frequency applied to the terminal 1 is converted into a high-pass frequency. The signal converted into the high-pass frequency is input into a second mixer 10 through a band-pass filter 7, an intermediate frequency amplifier 8, and further, a band-pass filter 9. In the second mixer 10, the intermediate frequency signal is converted into a fixed commercial frequency by using an oscillation output of a second local oscillator 11 and the frequency-converted signal is guided out from an output terminal 13 through a band-pass filter 12.

Generally, when non-linear distortion is generated in an amplifier, the input signal voltage and the output signal voltage of the amplifier have the following relation.

$$Ye = \sum_{n=1}^{m} Kn \cdot e^n \quad (1)$$

where
- $Ye$: output signal voltage of amplifier
- $e$: input signal voltage of amplifier
- $Kn$: coefficient showing linearity of amplifier
- $n$: degree of distortion In the equation (1), non-linear distortion of a fairly high degree may be generated. Practically, however, it is sufficient for design purpose to assume that second order distortion ($n=2$) or third order distortion ($n=3$) will occur.

When the distortion shown in the equation (1) is generated in a tuner, cross modulation interference or beat interference is generated. In this case, the cross modulation degree showing the degree of cross modulation interference is in proportion to the square of the amplitude of a signal giving cross modulation interference. This cross modulation distortion becomes very large as the number of transmission channels is increased.

On the other hand, beat interference is generated if distortion components generated in an amplifier exist in the band of a TV high-frequency signal when simultaneously transmitting a number of high-frequency signals.

From the viewpoint of suppressing the influence of amplifier in the tuner circuit shown in FIG. 4, an amplifier is not provided for the input signal of the first mixer 4. Instead, a circuit arrangement is substituted to eliminate the need for an amplifier, which causes distortion. As a result, cross modulation distortion generated in the tuner and distortion due to beat interference are reduced, but this does not improve the C/N ratio (carrier to noise ratio).

Generally, the C/N ratio is expressed by the following equation.

$$C/N \, (dB) = e_i \, (dB) - NF \, (dB) - 0.8 \, (dB) \quad (2)$$

Also, the total C/N ratio C/N(m) when the number of cascade amplifiers is taken as m, is determined by the following equation:

$$C/N(m) \, (dB) = C/N \, (dB) - 10 \cdot \log_{10} m \, (dB) \quad (3)$$

and the total C/N ratio C/N(m) is in inverse proportion to the number of cascade amplifiers m. In other words, when m sets of amplifiers are cascaded, $10 \cdot \log_{10} m$ (dB) and the C/N ratio are deteriorated. Accordingly, the input signal level $e_i$ of amplifiers on each portion, which is necessary for holding the C/N ratio obtained when m sets of amplifiers are cascaded to the same value as in one set, is expressed by the following equation.

$$e_i \, (dB) = e_{min} \, (dB) + 10 \cdot \log_{10} m \, (dB) \quad (4)$$

In the equation (4), $e_{min}$ is the minimum signal input level obtained by using the equation (2).

As will be clear from the above, for obtaining the C/N at a fixed value, it is required to set the signal level to a fixed level. That is, it is necessary to set the input/output level to the optimum level considering both of the characteristics of C/N ratio and distortion.

In the tuner circuit shown in FIG. 4, an amplifier is not provided for the input of the first mixer 4, and it is desired that the signal level be low from the aspect of generation of distortion. However, from the view-point of C/N ratio, the signal level necessary to achieve a given C/N ratio by an amplifier on the following stage cannot be obtained, and a problem of deterioration of C/N ratio arises.

For solving the problem, a tuner circuit is shown in FIG. 5 in which an amplifier 14 is interposed between the high-pass filter 2 and the low-pass filter 3 on the input side in the tuner circuit in FIG. 4. In this circuit, deterioration of C/N ratio can be prevented by the amplifier 14, which functions as a preamplifier.

With the amplifier 14 functioning as a preamplifier in the tuner circuit, which is shown in FIG. 5, the signal level is raised up to the input level shown by the equation (4) to obtain a fixed C/N ratio. However, second order distortion and third order distortion problems arise from the non-linear distortion of the amplifier.

Thus, the C/N ratio is improved, but when non-linear distortion exists in the amplifier 14, cross modulation distortion is generated. It is necessary, therefore, to control the gain of the amplifier 14 which functions to improve the C/N ratio so that generation of distortion such as cross modulation distortion is not promoted by a gain of more than required.

When m sets of amplifiers are cascaded, assuming the power gain of each amplifier to be $G_1, G_2, \ldots, G(m-1), G_m$ and the noise figure of each amplifier to be $NF_1, NF_2 \ldots NF_m$, the total noise figure $NF_t$ is expressed by the following equation.

$$NF_t = NF_1 + \frac{NF_2 - 1}{G_1} + \frac{NF_3 - 1}{G_1 \cdot G_2} + \ldots + \frac{NF_m - 1}{G_1 \cdot G_2 \cdot \ldots \cdot G(m-1)} \quad (5)$$

Considered from the stand point of the noise figure and C/N ratio, it is advantageous to control the amplification downstream from the mixer.

However, from the stand point of minimizing distortion it is more desirable to control the amplification on the upstream end of the mixer.

As a result, it is necessary to control the gain of a tuner, that is, to distribute the level of a signal so as not to deteriorate the distortion characteristics or the C/N ratio.

The up-down tuner described above reduces interference of adjacent-channel signals. However, as described above, regarding NF, the gain of an amplifier, which is shown in the equation (5) is regulated by the level distribution to be determined by the equation (4).

Therefore, in the tuner shown in FIG. 4 and FIG. 5, an AGC circuit is required for controlling the gain of the amplifier to maintain C/N ratio characteristics and prevent generation of distortion. A further problem arises as to how to suppress radiation of the output of the local oscillator.

SUMMARY OF THE INVENTION

Accordingly, an object of the present invention is to provide a tuner circuit which can maintain the C/N ratio characteristics in a prescribed desired amount and reduce non-linear distortions such as cross modulation and intermodulation distortions to a relatively low level.

Another object of the present invention is to provide a tuner circuit which can reduce the influence of output radiation of a local oscillator therein to a relatively low degree.

According to the present invention, therefore, a non-linear distortion in the RF amplifier output is suppressed and simultaneously, deterioration of C/N can be suppressed.

In order to achieve the above objects, the tuner circuit for converting the frequency of an input signal with a local oscillator to a predetermined channel frequency includes an attenuation circuit responsive to the output signal for controlling the attenuated level of the input signal for reducing cross modulation and intermodulation distortions of the circuit, and for reducing distortion from the interference of the local oscillation, an amplifier circuit coupled to the attenuation circuit for amplifying the attenuated input signal, and a frequency conversion circuit coupled to the amplifier circuit for converting the frequency of the amplified input signal to a corresponding predetermined channel frequency.

In one aspect of the present invention, for suppressing generation of non-linear distortion in a RF amplifier, a first attenuator attenuates a high-frequency input signal first and then an unnecessary high-pass signal component is removed and further a second attenuator attenuates the low-pass filter output and the signal is input into the RF amplifier through a tuning filter. The second attenuator buffers the low-pass filter and the tuning filter and together with the first attenuator, attenuates the input level of the RF amplifier to the degree where a non-linear distortion can be reduced and NF is not extremely deteriorated.

BRIEF DESCRIPTION OF THE DRAWINGS

FIG. 1 is a circuit diagram showing an embodiment of the tuner circuit according to the present invention;

FIG. 2 is a level chart for describing the operation of the circuit in FIG. 1;

DESCRIPTION OF THE PREFERRED EMBODIMENTS

Figure 3:
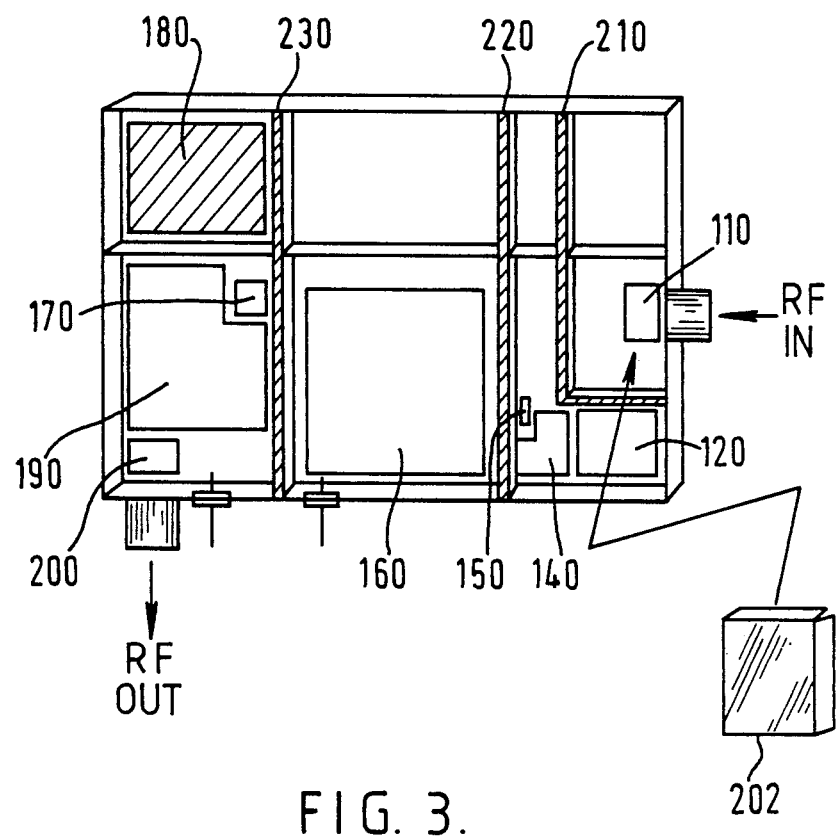
FIG. 3 is a perspective view showing an example of a tuner cabinet for storing the circuit in FIG. 1.
Figure 4:
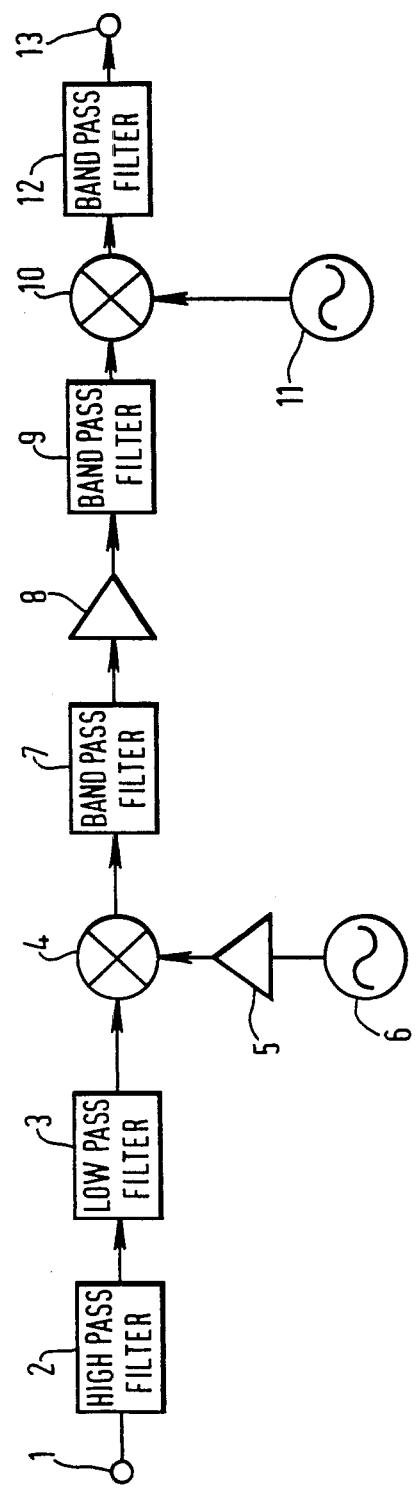
FIG. 4 and FIG. 5 are the circuits showing the conventional tuner circuit.
Figure 5:
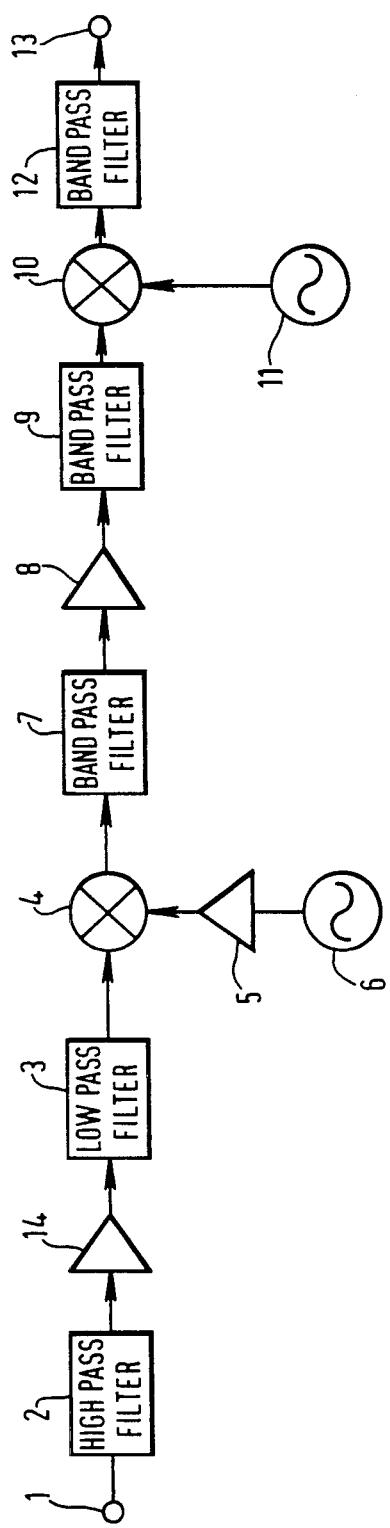

Referring now to the drawings, an embodiment of the present invention will be described.

As described above, in a tuner circuit, it is necessary to maintain the C/N ratio, while preventing distortion characteristics and reducing the influence of radiation caused by local oscillators. In particular, active elements in a tuner circuit exhibit non-linear distortion. It is necessary, therefore; to control the input signal level in a so-called RF amplifier. It also is necessary to suppress signals caused by radiation from local oscillators in both the forward and reverse directions. For example, a local ocsillator may leak an output signal used mainly for frequency conversion.

FIG. 1 is a circuit diagram showing an embodiment of a tuner circuit according to the present invention. The circuit shown in FIG. 1 illustrates a tuner circuit for receiving CATV broadcasts on the so-called midband.

In FIG. 1, a broadcast signal input to an input terminal IN, such as, an RF input signal is attenuated by about 4 dB by an attenuator 110. Thereafter, the high-pass component of the attenuated signal is blocked by a low-pass filter 120, including chebyshev-type filters. Ripple components caused by the Chebyshev characteristics are decreased by inductances L01, L02, and L03. The signal then is supplied to a single-tuned circuit 140 through a π type resistance circuit 130. In this case, the π type resistance circuit 130 has a buffer function and excellent interrupting characteristics, and is used as a means for further attenuating the ripple components.

The single-tuned circuit 140 functions to prevent generation of distortion signal components resulting from non-linearity of the active elements in RF amplifier 150.

In this case, the active element constituting the RF amplifier is an FET. The FET normally produces mainly second order non-linear distortion, but in this circuit the second order distortion components normally generated in the output of the RF amplifier 150 are prevented by the single-tuned circuit 140.

The output of the RF amplifier 150 is supplied to a double-tuned circuit 160 in the next stage through a coupling capacitor C15. The double-tuned circuit 160 includes a dualtuned circuit, and has the function of suppressing the intermodulation component of the second order distortion, the intermodulation component of the third order distortion and the cross modulation component caused by the active element of the RF amplifier. The double-tuned circuit 160 has a resonant characteristic curve as shown in FIG. 2 (III). The center frequency of the resonant curve is tuned to the object channel frequency Ch-O. Thus, adjacent channels such as first and second lower adjacent channels Ch-L1, Ch-L2, and first and second upper adjacent channels Ch-H1, Ch-H2 are suppressed in amplitude. The double-tuned circuit 160 also has a matching function with the mixer circuit 170 in the next stage of the circuit.

The unnecessary signal components not suppressed by the double-tuned circuit 160 are attenuated to some degree by a capacitor 165.

After this, in the mixer circuit 170, the signal frequency of the double-tuned circuit 160 is converted into a fixed oscillation frequency corresponding to the receiving channel by using the oscillation signal of a local oscillator 180 of the Colpitts oscillation circuit type. The output of the mixer circuit 170, which is frequency-converted as described above, is applied to a double-tuned circuit 190.

In the double-tuned circuit 190, unnecessary signals are removed by a first resonance circuit formed by an inductance L32 and capacitors C36, C37, and C99, a second resonance circuit formed by a capacitor C39 and an inductance L33, and a third resonance circuit formed by inductances L34 and L35 and a capacitance C41.

These three stage resonance circuits are operated as an output filter for totally suppressing the spurious signals caused by non-linearity of the RF amplifier 160. In this case, a notch filter may be used for attenuation of unnecessary signals, but insertion of a notch filter produces a large influence on the group delay frequency characteristics in the vicinity of picture carriers. For example, addition of one lower adjacent notch filter may deteriorate the group delay time at picture carrier frequency by about 50 nS (nano-second). For this reason, it is necessary to keep the number of notch filters as low as possible. In the embodiment shown in FIG. 1, a notch filter circuit is not used, but inductances L32 and L33 are effectively mutually coupled by using the inductance component from the lead terminal of a capacitor C99 of the first resonance circuit. As a result, for the first resonance circuit and the second resonance circuit, capacitors C38 and C39 are capacity division coupled in concentrated constant, but they are mutually coupled in distributed constant to show a proper amount of notch filter characteristics on the lower adjacent channel. They thus form a trap for removing unnecessary signals without adversely effecting group delay frequency characteristics. The double-tuned circuit 190 has a resonant characteristic curve as shown in FIG. 2 (IV). The center frequency of the resonant curve is tuned to the object channel frequency Ch-O. Thus, adjacent channels such as first and second lower adjacent channels Ch-L1, Ch-L2, and first and second upper adjacent channels Ch-H1, Ch-H2 are suppressed their amplitude.

The output of the double-tuned circuit 190 is guided into the output terminal OUT through an attenuator 200. The oscillation frequency of the first, second, and third resonant circuits of the double-tuned circuit 190 can be controlled by adjusting the inductance value of each inductance L32, L33, L34, and L35. The frequency level of the output of the double-tuned circuit 190 is adjusted in the attenuator circuit of the next stage.

In this case, the attenuator 200 serves to attenuate so-called back talk due to mismatching of impedance from the RF OUT terminal side, and contributes to reducing generation of the radiation components of the local oscillator 180 in the RF OUT terminal.

A satisfactory D/U ratio (ratio of a desired wave signal level and an undersired wave signal level) can be obtained at the tuner output end by level distribution of signals suitable for suppression of distortion. Suppression of leakage signals from local oscillators can be accomplished with a tuner circuit according to the present invention, as shown in FIG. 1.

In a tuner with a primary function of converting high-frequency signals into intermediate frequency signals according to given frequency characteristics, so-called beat distortion during frequency conversion and cross modulation distortion from the RF amplifier are problems.

RF amplifier 150 is used for suppressing unnecessary signals in the reverse direction, but creates distortion according to equation (1), caused by non-linearity of the amplifier. In this case, cross modulation distortion is caused when the amplitude of one channel influences the amplitude of other channels. Intermodulation distortion resulting from the sum or the difference of the frequencies of different channel signals is generated as a distortion signal. Among these two distortions, cross modulation distortion has the greatest influence.

In mixer circuit 170, in which frequency conversion is the essential function, beat interference due to intermodulation is generated. In this case, frequency conversion operations in the mixer circuit 170 are performed by multiplying the oscillation output of the local oscillator 180 with the input signal. For this purpose, it is necessary to minimize leakage from the local oscillator 180 into other circuit portions, and to reduce the leakage signal level to the input terminal side of the tuner.

Considering now the cross modulation distortion in the mixer circuit 170, taking the oscillation frequency in the local oscillator 80 as fosc, the picture carrier frequency of the receiving channel as fp, and the audio carrier frequency as fs, the interference signal frequency fIM due to intermodulation distortion is expressed by the following equations.

$$fIM = fp + fs - fosc \quad (6)$$

$$fIM = 2fp - fosc \quad (7)$$

FIG. 2 is a chart showing the signal level in each part in the circuit of the present invention, as shown in FIG. 1. In the drawing, a solid line shows the signal level in the forward direction and a broken line the signal level in the reverse direction. The filter characteristics of various components are indicated by separate curves labelled (I, II, III, and IV) in FIG. 2.

First, description is made regarding the signal in the forward direction. For preventing deterioration of C/N ratio and noise figure, the signal levels are distributed according to equations (3) and (4).

The RF input signal is attenuated by about 4 dB by the attenuator 110 of the first stage, and unnecessary high-pass signals are removed by the low-pass filter 120, including attenuation band non-polar type Chebyshev filters (FIG. 2 (I)).

The transmission frequency characteristics of an attenuation band non-polar type Chebyshev filter are expressed by the following equation.

$$L = 10 \cdot \log\left[1 + \left(\frac{(S+1)^2}{4S} - 1\right) Tn(x)^2\right] (dB) \quad (8)$$

$$X = \frac{fo}{B} \cdot \left(\frac{f}{fo} - \frac{fo}{f}\right) \quad (9)$$

where
Tn(x): Chebyshev polynomial
n: degree of filter
fo: center frequency
S: VSWR of pass band
B: pass band width The necessary filter degree can be obtained from the given voltage standing wave ratio (VSWR) and the pass band width.

In the output of the attenuator 110, spurious components such as fp+6MHz and fs+6MHz are present, but these components are gradually attenuated in the following stages, as opposed to instant attenuation when using a notch filter. The use of a notch filter increases group delay time and deteriorates picture quality.

In the attenuator 130 in the following stage of the low-pass filter, about 2 dB is attenuated. The attenuation level of each of the attenuators 110 and 130 is small. This allows these attenuators to have a buffer function. That is, the attenuator 130 has a buffer function on the low-pass filter 120 and the single-tuned circuit 140 in the following stage.

The single-tuned circuit 140 sets the frequency of a receiving band at a center frequency. For example, when receiving a CATV broadcast at midband, the center frequency is set to the midband frequency (FIG. 2 (II)).

By filter operation on two stages of the low-pass filter 110 and the single-tuned circuit 140, unnecessary signals causing cross modulation distortion and intermodulation distortion are attenuated. In this state, the RF amplifier 150 amplifies the input high-frequency signal. By this amplifying operation, the noise figure is improved. The RF amplifier 150 suppresses the leakage level of the local oscillator 180, and has an isolation function between the input and output terminals. As will be clear from FIG. 2, the leakage level of the local oscillator 180 is attenuated by about 30 dB in the reverse direction.

In the signal obtained at the output of the RF amplifier 150, cross modulation distortion is generated due to the non-linear distortion of the RF amplifier. However, this distortion component is removed to some degree by band-pass characteristics of the double-tuned circuit 160 in the following stage. The pass band frequency characteristics of the double-tuned circuit 160 and the single-tuned circuit 140 are controlled by a tuning voltage Vt corresponding to a selected channel. Signal transmissions between the single-tuned circuit 140 and the RF amplifier 150, or between the RF amplifier 150 and the double-tuned circuit 160 is performed by divided capacitor circuit forms, and this also serves to attenuate the absolute value of the cross modulation distortion component.

The output of the double-tuned circuit 160 is applied to the mixer 170 as a receiving high-frequency signal through a coupling capacitor 165. In the mixer 170, the receiving high-frequency signal is frequency-converted by using the oscillation output of the local oscillator 180.

This frequency converting operation uses a multiplying operation of a FET in the mixer 170, but intermodulation distortion is generated at this time. The gain of the mixer 170 itself is about 15 dB.

The double-tuned circuit 190 includes three resonant circuits, and the band pass frequency characteristics for a receiving channel are set by these three-tuned circuits. In this case, it is necessary to sufficiently suppress the intermodulation distortion shown in equations (6) and (7), and it is desired to suppress leakage from the local oscillator 180, which causes the intermodulation. Further, in a pay TV system, it is necessary to attenuate the signal component on the lower side of a receiving channel to prevent the poaching of the lower side adjacent channel by attenuation of the first and second adjacent channel signals Ch-L1, Ch-L2, Ch-U1, Ch-U2 (see FIGS. 2 (III), 2 (IV)). Setting the pass band frequency characteristics in the following stage of the mixer circuit 170 of this type may be performed by using a surface wave filter. However, an unnecessary signal may be fed back to the preceeding side of the surface wave filter and distortion may result from generation of unnecessary radiation energy such as a triple transient echo (TTE) or a bulk wave in the surface wave filter component. Further, to compensate for the attenuation amount of a signal in a surface wave filter, it is necessary to provide an amplifier on the following stage, and the distortion is increased due to the non-linear distortion of this amplifier. For this reason, the present embodiment the circuit is designed so that a distortion signal component may be attenuated by the double-tuned circuit 190 without using a surface wave filter component.

As described before, the double-tuned circuit 190 includes three resonant circuits. Each resonant circuit includes a divided capacitor circuit, and is suitable for preventing transmission of an unnecessary signal to the following stage. In this case, the inductor in each resonant circuit may be inductively coupled to each other as necessary. This is for the purpose of removing an unnecessary signal by controlling the pass-band characteristics through control of the induction coupling factor. In addition, this suppresses the intermodulation distortion component in the frequency band on the lower side of the pass band and the lower side adjacent and next adjacent channel signal components Ch-a, Ch-b.

Also, the resonant circuit on the last stage of the double-tuned circuit 190 is of the divided inductor circuit type, and is coupled to the attenuator 200 on the next stage. The Q (resonant characteristics) of the resonant circuit is matched in correspondence with the set load value by adjustment of the division ratio of the inductance.

The attenuator 200 of the last stage contributes to control of the power gain of the tuner and reduction of output return loss.

Next, the chart shown in FIG. 2 will be described. As will be clear from the input signal level shown by the solid line in the drawing, and particularly between A and E of the solid line of FIG. 2, the input signal is attenuated by about 8 dB in total amount on the input side of the RF amplifier to reduce a cross modulation distortion as much as possible. The amplifier has a non-linear active element which is the cause of the distortion. In this case, 8 dB is not attenuated all at once, but the input is distributed to the attenuator 110, the low-pass filter 120, the attenuator 130, and the single-tuned circuit 140, so that each element can attenuate a certain amount. This prevents deterioration of NF (noise figure) caused by attenuating too fast. In the same manner as described above, the input of the mixer 170 is distributed to the capacitor C15, the double-tuned circuit 160, and the attenuator 165 to attenuate the output of the RF amplifier 150 and suppress generation of intermodulation distortion in the mixer circuit 170. The cross modulation component which is not suppressed in the mixer circuit 170 is suppressed by the double-tuned circuit 90 on the next stage and the distortion compoment is reduced as much as possible. In this case, it is necessary to remove the unnecessary component on the lower side of the receiving channel by the double-tuned circuit 190, as described before.

Referring to the chart shown in FIG. 2, description will be made regarding the leakage of the output of the local oscillator 180, and the influence of reflected waves.

As shown in FIG. 1, the local oscillator 180 is formed by, for example, a Colpitts resonant circuit, and the oscillation frequency is determined corresponding to a tuning voltage applied to a varactor diode. The oscillation energy is applied to the mixer circuit 140 for the frequency conversion operation in the mixer circuit 170. In this case, the output of the local oscillator 170 leaks to the preceeding stage side of the mixer circuit 170, and also it is applied to other circuits by radiation energy.

In FIG. 2, the broken line shows unnecessary oscillation energy in the reverse direction. The oscillation energy in the mixer circuit 170 functions as a coupling capacitor in the reverse direction and local oscillation output is attenuated by the attenuator 165. Next the output is attenuated by about 18 dB by filter operation of the double-tuned circuit 160.

In this case, the unnecessary signal component of the local oscillator 180 is greatly attenuated on the input end side of the local oscillator 180 by the isolation function of the RF amplifier 150. When the amount of attenuation of the coupling capacitor C15 is added to the attenuation in the reverse direction of the local oscillator unnecessary signal component between the input and the output end of the RF amplifier 150, the total attenuation is about 40 dB.

About 15 dB then is attenuated by the signal-tuned circuit 140 and the attenuator 130 and further, about 30 dB is attenuated by the filter operation of the low-pass filter 120. Finally about 5 dB is attenuated by the attenuator 110. Thus, in total, the unnecessary signal component of the local oscillator 180 is suppressed by about 110 dB on the RF input terminal side. By this operation, generation of cross modulation distortion and intermodulation distortion due to the unnecessary signal components is suppressed.

As described above, the unnecessary signal energy of the local oscillator 180 in the reverse direction also is suppressed, but it also is necessary to suppress the irradiation energy.

FIG. 3 is a perspective view of a cabinet structure showing the circuit arrangement in a cabinet of a tuner circuit suitable for preventing generation of distortion due to radiation energy of the local oscillator 180. In the drawing, like reference symbols designate like parts in FIG. 1. The local oscillation circuit 180 is arranged apart from the RF input terminal and the RF IN. The attenuator 110, which is an input circuit section, is partitioned with a partitioning shielding member 210 for preventing intrusion of unnecessary signals, and the circuit section of the attenuator 110 is securely shielded by a sectioning shielding plate 225 to prevent the influence to the input side caused by radiation energy from the local oscillator 180.

Further, the RF amplifier 150 and the mixer circuit 170 are partitioned from one another with shielding members 220 and 230. As a result, the input and output terminals of the RF amplifier 150 are further isolated and unnecessary signals are prevented by the double-tuned circuit 160.

As described above, generation of distortion due to oscillation output of the local oscillator 180 can be prevented, and cross modulation distortion and intermodulation distortion also can be prevented.

The present invention provides a tuner circuit, in which the signal level attenuation distribution of the forward signal maintains a prescribed NF value on the preceeding stage of the RF amplifier 150 to suppress non-linear distortion due to the non-linearity of the RF amplifier. In addition, the invention properly attenuates unnecessary signals of the local oscillator 180.

Thus, non-linear distortion of the original signal can be suppressed without deterioration of NF, and unnecessary signals of the local oscillator 180 also can be attenuated to a proper level.

As a result, the C/N ratio and NF level required for a tuner and of NF can be maintained, and generation of distortion such as cross modulation distortion and intermodulation distortion can be prevented. Thus, proper function of the tuner for converting a receiving high-frequency signal frequency into a fixed frequency can be carried out.

Further, the tuner circuit according to the present invention may be used with a so-called up-down tuner, and the applicable frequency is not limited to the midband frequency range, but is applicable to the usual broadcast bands.

What is claimed is:

1. A tuner circuit comprising an input terminal for inputting a received radio frequency signal, a first attenuating circuit connected to the input terminal, a low-pass filter connected with the first attenuating circuit, a second attenuator for attenuating ripple components of the filtered signal from the low-pass filter, a tuned filter connected to the second attenuator for passing therethrough at least a prescribed frequency band, an amplifier connected to the tuned filter for amplifying the tuned signal from the tuned filter, a local oscillation circuit for generating a local frequency signal, a mixer circuit for converting the frequency of the amplified signal from the amplifier into a corresponding channel frequency under the influence of the local frequency signal from the local oscillation circuit, and an output terminal for outputting a frequency-converted signal by the mixer circuit, whereby a fixed quantity of a signal leaked to the input terminal side is attenuated irrespective of isolation operation of the amplifier to suppress deterioration of the noise figure of a forward signal and a distortion signal at the output terminal.

* * * * *